United States Patent
Shi

(10) Patent No.: US 10,191,339 B2
(45) Date of Patent: Jan. 29, 2019

(54) BOA LIQUID CRYSTAL PANEL BASED ON IGZO-TFT AND METHOD FOR MANUFACTURING THE SAME

(71) Applicant: Shenzhen China Star Optoelectronics Technology Co., Ltd., Shenzhen, Guangdong (CN)

(72) Inventor: Longqiang Shi, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 15/328,920

(22) PCT Filed: Jan. 5, 2017

(86) PCT No.: PCT/CN2017/070280
§ 371 (c)(1),
(2) Date: Nov. 13, 2017

(87) PCT Pub. No.: WO2018/040464
PCT Pub. Date: Mar. 8, 2018

(65) Prior Publication Data
US 2018/0210298 A1    Jul. 26, 2018

(30) Foreign Application Priority Data
Aug. 31, 2016    (CN) .......................... 2016 1 0796745

(51) Int. Cl.
*H01L 27/108*    (2006.01)
*G02F 1/1362*    (2006.01)
(Continued)

(52) U.S. Cl.
CPC ...... *G02F 1/136209* (2013.01); *G02F 1/1362* (2013.01); *G02F 1/1368* (2013.01);
(Continued)

(58) Field of Classification Search
None
See application file for complete search history.

(56) References Cited

U.S. PATENT DOCUMENTS 4,940,627 A * 7/1990 Kittler, Jr. ................. G03F 1/54
                                                           428/203
5,760,861 A * 6/1998 Kim ................... G02F 1/136209
                                                           349/110
(Continued)

FOREIGN PATENT DOCUMENTS

CN    102122598 A    7/2011
CN    102473571 A    5/2012
(Continued)

OTHER PUBLICATIONS

Search Report and Written Opinion, dated Apr. 27, 2017, for International Application No. PCT/CN2017/070280.
(Continued)

*Primary Examiner* — Dung Le

(57) ABSTRACT

Provided is a BOA liquid crystal panel based on an IGZO-TFT and a method for manufacturing the same. The method includes steps of: (1) forming a black matrix; (2) forming a gate; (3) forming a gate insulator; (4) forming a source and a drain; (5) forming IGZO; (6) forming a passivation; (7) forming R/G/B color resist; (8) forming ITO. Copper oxide is used as a coplanar structure of the black matrix of an IGZO-TFT based BOA component, which can effectively prevent the risk of etching IGZO.

9 Claims, 3 Drawing Sheets

(51) Int. Cl.
    *G02F 1/1368* (2006.01)
    *H01L 21/02* (2006.01)
    *H01L 21/027* (2006.01)
    *H01L 21/443* (2006.01)
    *H01L 21/467* (2006.01)
    *H01L 21/4763* (2006.01)
    *H01L 27/12* (2006.01)
    *H01L 29/423* (2006.01)
    *H01L 29/43* (2006.01)
    *H01L 29/49* (2006.01)
    *H01L 29/66* (2006.01)
    *H01L 29/786* (2006.01)

(52) U.S. Cl.
    CPC .... *H01L 21/0274* (2013.01); *H01L 21/02164* (2013.01); *H01L 21/02175* (2013.01); *H01L 21/02244* (2013.01); *H01L 21/02271* (2013.01); *H01L 21/02565* (2013.01); *H01L 21/02631* (2013.01); *H01L 21/443* (2013.01); *H01L 21/467* (2013.01); *H01L 21/47635* (2013.01); *H01L 27/127* (2013.01); *H01L 27/1225* (2013.01); *H01L 27/1262* (2013.01); *H01L 29/42356* (2013.01); *H01L 29/437* (2013.01); *H01L 29/4908* (2013.01); *H01L 29/66969* (2013.01); *H01L 29/7869* (2013.01); *G02F 2001/136222* (2013.01); *G02F 2202/10* (2013.01)

(56) References Cited

U.S. PATENT DOCUMENTS

| | | | |
|---|---|---|---|
| 2006/0232728 | A1* | 10/2006 | Kim .................. G02F 1/1333 349/106 |
| 2010/0065842 | A1 | 3/2010 | Yamazaki et al. |
| 2013/0056732 | A1* | 3/2013 | Jung .................. G06F 3/0412 257/53 |
| 2015/0303307 | A1* | 10/2015 | Hara .................. H01L 29/7869 349/43 |

FOREIGN PATENT DOCUMENTS

| | | | |
|---|---|---|---|
| CN | 103744224 | A | 4/2014 |
| CN | 103744225 | A | 4/2014 |
| CN | 104503127 | A | 4/2015 |
| CN | 106226965 | A | 12/2016 |

OTHER PUBLICATIONS

Office Action and Search Report, dated Jan. 4, 2018, for Chinese Patent Application No. 201610796745.2.

\* cited by examiner

BOA LIQUID CRYSTAL PANEL BASED ON IGZO-TFT AND METHOD FOR MANUFACTURING THE SAME

FIELD OF THE INVENTION

The present disclosure relates to the field of liquid crystal, and in particularly to a BOA liquid crystal panel based on an IGZO-TFT and a method for manufacturing the same.

BACKGROUND OF THE INVENTION

Black matrix on array (BOA) technique is a popular technique for manufacturing a liquid crystal display (LCD) panel. In a BOA process, a color filter (CF) substrate is not used, which renders a CF process unnecessary and can reduce costs, improve the alignment precision of the manufacturing process, and is conducive to manufacture of display devices of high aperture ratio and high resolution.

In a traditional BOA process, a black matrix (BM) is an organic photoresist, and patterning is performed after coating of R/G/B color resist. Since the BM has a high requirement for optical density, but the optical density of the existing BM for a BOA structure is low, a coating of the BM is extremely thick. However, the thick BM coating can shield alignment marks on the array substrate, which is not conducive to exposure alignment in the process. Further, for a BM with large height, it is difficult to control a taper angle thereof and the taper angle is relatively steep, which may cause breakage of pixel indium tin oxide (ITO; ITO is an N-type oxide semiconductor, and ITO thin film is indium tin oxide semiconductor transparent conductive film) when ITO laps on the BM.

Metal oxides have good insulativity. However, many metal oxides, especially those materials that are widely used in industrial applications, such as aluminum oxide ($Al_2O_3$), have good transmissivity, and are not suitable for use as a BM material. The inventors of the present disclosure found that copper oxide (CuO) as a black oxide is easily used in industrial production and can be used as a BM material.

IGZO (indium gallium zinc oxide, a metal oxide) is a good material for an active layer of a thin film transistor (TFT) because of its high mobility, good film formation uniformity, easiness in large-size production, and because it can be applied in the same manufacturing process as arsenic (As). In recent years, IGZO has been widely developed. Similar to ITO, IGZO is easy to be etched by aluminum hydroxide ($Al(OH)_3$), so it is generally not suitable for use as a component with a back channel etched (BCE) structure. This is because, in a BCE structure, an IGZO layer is etched away when a source and a drain are formed by etching, which can result in failure in the manufacture of the TFT component.

In view of the foregoing, the inventors of the present disclosure designed a BOA liquid crystal panel based on an IGZO-TFT and a method for manufacturing the same to eliminate the above-mentioned defect.

SUMMARY OF THE INVENTION

It is an object of the present disclosure to provide a BOA liquid crystal panel based on an IGZO-TFT and a method for manufacturing the same. In the present disclosure, copper oxide is used as a coplanar structure of a black matrix of a IGZO-TFT based BOA component, which effectively prevents the risk of etching IGZO.

In order to achieve the above object, the present disclosure provides a method for manufacturing a BOA liquid crystal panel based on an IGZO-TFT. The method comprising steps of:

(1) forming a black matrix, which comprises:
  forming a copper film on a substrate,
  oxidizing the copper film to obtain a copper oxide film, and
  patterning the copper oxide film and exposing an opening area to obtain a black matrix pattern;

(2) forming a gate, which comprises forming a gate film on the black matrix pattern, and then exposing the gate film to radiation to obtain a gate pattern;

(3) forming a gate insulator), which comprises forming a gate insulator film on the resulting structure of step (2) to form a gate insulator film;

(4) forming a source and a drain, which comprises forming a source film and a drain film on a part of the gate insulator film which covers the gate pattern, and then exposing the source film and the drain film to obtain a source pattern and a drain pattern;

(5) forming IGZO, which comprises forming a IGZO film on a part of the gate insulator film which covers the gate pattern and is between the source and the drain to obtain an IGZO pattern;

(6) forming a passivation, which comprises forming a passivation film on the resulting structure of step (5), and forming a contact hole passing through the passivation film on the source and the drain;

(7) forming R/G/B color resist, which comprises coating the resulting structure of step (6) except the contact hole, with R/G/B color resist, and exposing the coating to radiation to obtain a desired pattern;

(8) forming ITO, which comprises covering the contact hole and the opening area with an ITO film, and exposing the ITO film to radiation to obtain an ITO pattern.

According to the method for manufacturing a BOA liquid crystal panel based on an IGZO-TFT, in step (1), the copper film is formed by physical vapor deposition.

According to the method for manufacturing a BOA liquid crystal panel based on an IGZO-TFT, in step (2), the gate film is formed by physical vapor deposition, and the gate pattern is obtained by subjecting the gate film to exposure and to dry etching. The gate pattern is made of copper.

According to the method for manufacturing a BOA liquid crystal panel based on an IGZO-TFT, in step (3), the gate insulator film is formed by chemical vapor deposition, and the gate insulator film is made of silicon dioxide.

According to the method for manufacturing a BOA liquid crystal panel based on an IGZO-TFT, in step (4), the source film and the drain film are formed by physical vapor deposition, and the source pattern and the drain pattern are obtained by subjecting the source film and the drain film to exposure and to wet etching, and the source pattern and the drain pattern are made of copper According to the method for manufacturing a BOA liquid crystal panel based on an IGZO-TFT, in step (5), the metal oxide IGZO film is formed by physical vapor deposition, and the IGZO pattern is obtained by subjecting the IGZO film to exposure and to wet etching.

According to the method for manufacturing a BOA liquid crystal panel based on an IGZO-TFT, in step (6), the passivation film is formed by chemical vapor deposition, and the passivation film is made of SiO2.

According to the method for manufacturing a BOA liquid crystal panel based on an IGZO-TFT, in step (8), the ITO film is formed by physical vapor deposition, and the pattern is obtained by subjecting the ITO film to exposure and to wet etching.

The present disclosure further provides a BOA liquid crystal panel based on an IGZO-TFT. The liquid crystal panel mainly comprises a substrate having a BM pattern thereon. An opening area of the BM pattern is exposed. The BM pattern has a gate pattern thereon. The substrate, the BM pattern, and the gate pattern have a gate insulator film thereon. The gate pattern covered by the gate insulator film has a source and a drain thereon. An IGZO film is provided on a part of the gate insulator film which covers the gate pattern covered and is between the source and the drain. A passivation film is provided on the whole resulting structure, and the passivation film has a contact hole at a position corresponding to the source and the drain. R/G/B color resist is applied to the entire resulting structure, except the contact hole. The contact hole and the opening area are covered with an ITO pattern.

In the BOA liquid crystal panel based on an IGZO-TFT, the black matrix pattern is formed of copper oxide.

The present disclosure brings the following beneficial effects. The present disclosure provides an IGZO-TFT based BOA component using CuO as the coplanar structure of a BM, and effectively overcomes the difficulty of the prior art in manufacturing a BM of a BOA structure, and in etching IGZO in the BCE structure in the IGZO-TFT. In addition, the present disclosure adopts a bottom-gate structure (coplanar), so that a source and a drain can be formed before the formation of IGZO, whereby the risk of etching IGZO can be avoided.

BRIEF DESCRIPTION OF THE DRAWINGS

The present disclosure will be described in more detail below by way of embodiments and with reference to the accompanying drawings, in which.

In the drawings, same reference numerals are used for same parts. The drawings are not provided by an actual proportion.

DETAILED DESCRIPTION OF THE EMBODIMENTS

The present disclosure will be further described below with reference to the accompanying drawings.

The present disclosure provides a method for manufacturing a BOA liquid crystal panel based on an IGZO-TFT. The method comprises the following steps.

Figure 1:
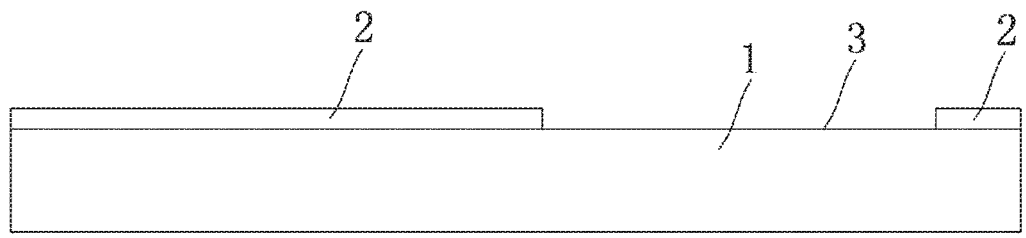
FIG. 1 is a schematic diagram of manufacturing a BM pattern.

(1) Forming a Black Matrix (BM):

As shown in FIG. 1, first, a copper (Cu) film is formed on a substrate 1 by physical vapor deposition (PVD) followed by $O_2$ plasma treatment to obtain a copper oxide (CuO) layer. That is to say, the copper oxide layer is used as a barrier layer of a BM for patterning, and an opening area 3 is exposed. Then the copper oxide layer is exposed to radiation, and subjected to wet etching to obtain a BM pattern 2. It needs to be noted that only the opening area 3 of the BM pattern is exposed.

Figure 2:
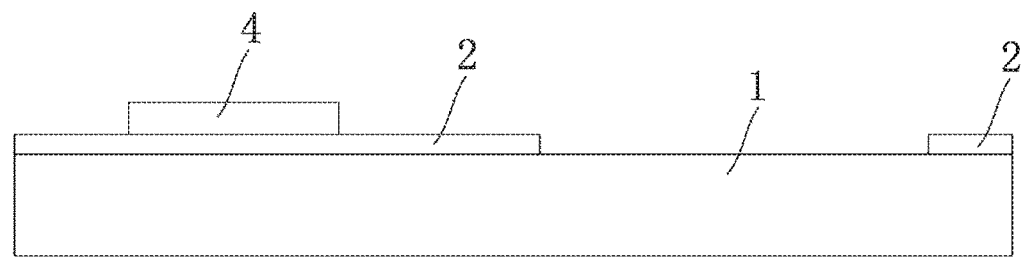
FIG. 2 is a schematic diagram of manufacturing a gate pattern.

(2) Forming a Gate:

As shown in FIG. 2, a gate film is formed on the BM pattern 2 by PVD, and then the gate film is exposed to radiation, and subjected to dry etching to obtain a gate pattern 4. Preferably, the gate pattern 4 is made of copper (Cu).

Figure 3:
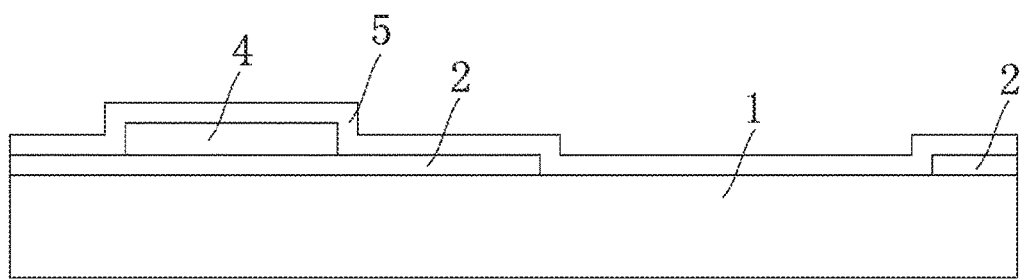
FIG. 3 is a schematic diagram of manufacturing a GI (gate insulator) film.

(3) Forming a GI (Gate Insulator):

As shown in FIG. 3, a GI film formed by chemical vapor deposition (CVD) on the entire surface of the substrate. Preferably, the GI film 5 is made of silicon dioxide ($SiO_2$).

Figure 4:
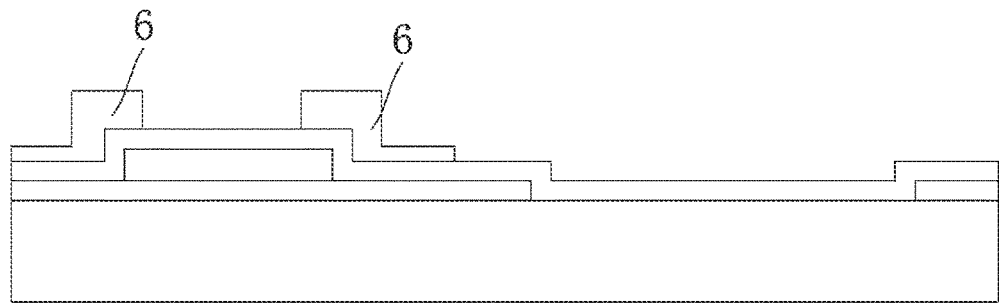
FIG. 4 is a schematic diagram of manufacturing a source and a drain.

(4) Forming a Source and a Drain:

As shown in FIG. 4, a source film and a drain film are formed on a part of the GI film 5 which covers the gate pattern 4 by PVD, and then the source film and the drain film are exposed to radiation and subjected to wet etching to obtain a source and a drain pattern. Preferably, the source and the drain pattern 6 are made of copper (Cu).

Figure 5:
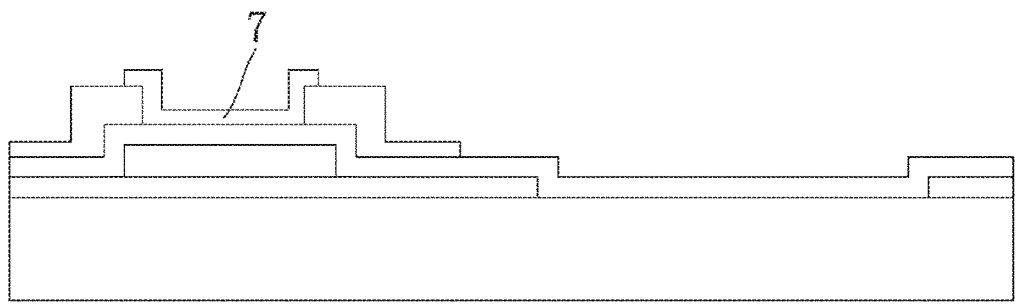
FIG. 5 is a schematic diagram of manufacturing an IGZO film.

(5) Forming a Metal Oxide:

As shown in FIG. 5, a metal oxide (IGZO) film is formed on a part of the GI film 5 which covers the gate pattern 4 and which is between the source and the drain 6 by PVD, and then the metal oxide film is exposed to radiation and subjected to wet etching to obtain a metal oxide (IGZO) pattern 7.

Figure 6:
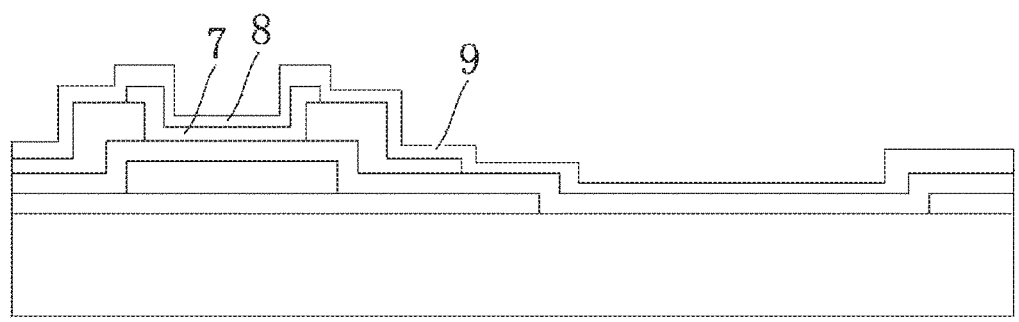
FIG. 6 is a schematic diagram of manufacturing a PV (passivation) film.

(6) Forming a PV (Passivation):

As shown in FIG. 6, a PV film 8 is formed by CVD on the entire resulting structure, and a contact hole 9 of pixel passing through the PV film 8 and located on the source and the drain pattern 6 is obtained by dry etching. Preferably, the PV film is made of $SiO_2$.

Figure 7:
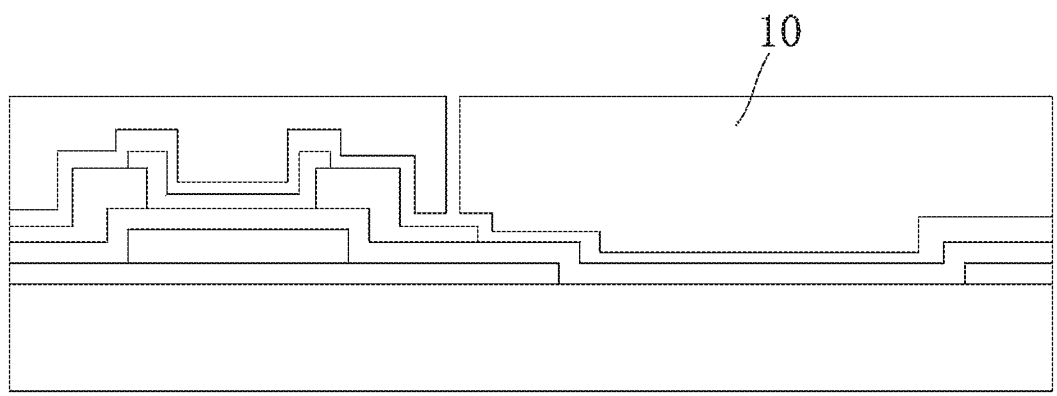
FIG. 7 is a schematic diagram of manufacturing R/G/B color resist.

(7) Forming R/G/B Color Resist:

As shown in FIG. 7, the resulting structure, except the contact hole, is coated with R/G/B color resist and is exposed radiation to obtain a desired pattern.

Figure 8:
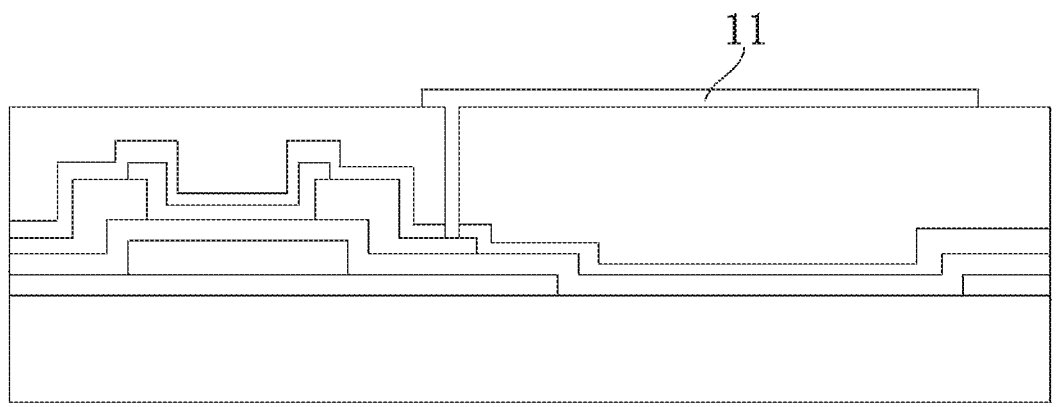
FIG. 8 is a schematic diagram of manufacturing an ITO pattern.

(8) Forming ITO (Indium Tin Oxide):

As shown in FIG. 8, an ITO film is formed to cover the contact hole 9 and the opening region 3 by PVD, and the ITO film is then exposed to radiation and subjected to wet etching to obtain an ITO pattern 11.

The present disclosure further provides a BOA liquid crystal panel based on an IGZO-TFT. The liquid crystal panel mainly comprises, as shown in FIG. 8, a substrate 1 having a BM pattern 2 thereon. An opening area 3 of the BM pattern 2 is exposed. The BM pattern has a gate pattern 4 thereon. The substrate 1, the BM pattern 2, and the gate pattern 4 have a GI film 5 thereon. The gate pattern 4 covered by the GI film 5 has a source and a drain 6 thereon. An IGZO film 7 is provided on the gate pattern 4 covered by the GI film and between the source and the drain 6. A PV film 8 is provided on the whole resulting structure, and the PV film 8 has a contact hole 9 at a position corresponding to the source and the drain 6. R/G/B color resist 10 is applied to the entire resulting structure, except the contact hole 9. The contact hole 9 and the opening area 3 are covered with an ITO pattern 11.

In view of the above, the present disclosure brings the following beneficial effects.

The present disclosure provides an IGZO-TFT based BOA component using CuO as the coplanar structure of a BM, and effectively overcomes the difficulty of the prior art in manufacturing a BM of a BOA structure, and in etching IGZO in the BCE structure in the IGZO-TFT. In addition, the present disclosure adopts a bottom-gate structure (coplanar), so that a source and a drain can be formed before the formation of IGZO, whereby the risk of etching IGZO can be avoided.

Although the present disclosure has been described with reference to preferred embodiments, various modifications may be made thereto without departing from the scope of the present disclosure, and equivalents may be used for replacing the components therein. In particular, the technical features mentioned in the various embodiments may be combined in any manner as long as there is no structural conflict. The present disclosure is not limited to the specific embodiments disclosed herein, but includes all the technical solutions falling within the scope of the claims.

The invention claimed is:

1. A method for manufacturing a BOA liquid crystal panel based on an IGZO-TFT, comprising steps of:
   (1) forming a black matrix, which comprises:
     forming a copper film on a substrate,
     oxidizing the copper film to obtain a copper oxide film, and
     patterning the copper oxide film and exposing an opening area to obtain a black matrix pattern;
   (2) forming a gate, which comprises forming a gate film on the black matrix pattern, and then exposing the gate film to radiation to obtain a gate pattern, wherein the gate film is formed by physical vapor deposition, and the gate pattern is obtained by subjecting the gate film to exposure and to dry etching, and the gate pattern is made of copper;
   (3) forming a gate insulator, which comprises forming a gate insulator film on the resulting structure of step (2) to form a gate insulator film;
   (4) forming a source and a drain, which comprises forming a source film and a drain film on a part of the gate insulator film which covers the gate pattern, and then exposing the source and the drain film to obtain a source and a drain pattern;
   (5) forming IGZO, which comprises forming a IGZO film on a part of the gate insulator film which covers the gate pattern and is between the source and the drain to obtain an IGZO pattern;
   (6) forming a passivation, which comprises forming a passivation film on the resulting structure of step (5), and forming a contact hole passing through the passivation film on the source and the drain;
   (7) forming R/G/B color resist, which comprises coating the resulting structure of step (6) except the contact hole, with R/G/B color resist, and exposing the coating to radiation to obtain a desired pattern; and
   (8) forming ITO, which comprises covering the contact hole and the opening area with an ITO film, and exposing the ITO film to radiation to obtain an ITO pattern.

2. The method for manufacturing a BOA liquid crystal panel based on an IGZO-TFT according to claim 1, characterized in that in step (1), the copper film is formed by physical vapor deposition.

3. The method for manufacturing a BOA liquid crystal panel based on an IGZO-TFT according to claim 1, characterized in that in step (3), the gate insulator film is formed by chemical vapor deposition, and the gate insulator film is made of silicon dioxide.

4. The method for manufacturing a BOA liquid crystal panel based on an IGZO-TFT according to claim 1, characterized in that in step (4), the source and the drain film are formed by physical vapor deposition, and the source pattern and the drain pattern are obtained by subjecting the source film and the drain film to exposure and to wet etching, and the source pattern and the drain pattern are made of copper.

5. The method for manufacturing a BOA liquid crystal panel based on an IGZO-TFT according to claim 1, characterized in that in step (5), the metal oxide IGZO film is formed by physical vapor deposition, and the IGZO pattern is obtained by subjecting the IGZO film to exposure and to wet etching.

6. The method for manufacturing a BOA liquid crystal panel based on an IGZO-TFT according to claim 1, characterized in that in step (6), the PV film is formed by chemical vapor deposition, and the PV film is made of $SiO_2$.

7. The method for manufacturing a BOA liquid crystal panel based on an IGZO-TFT according to claim 1, characterized in that in step (8), the ITO film is formed by physical vapor deposition, and the ITO pattern is obtained by subjecting the ITO film to exposure and to wet etching.

8. A BOA liquid crystal panel based on an IGZO-TFT, comprising a substrate, wherein:
   the substrate is provided thereon with a black matrix pattern, an opening area of the black matrix pattern being exposed, and the black matrix pattern being provided thereon with a gate pattern made of copper, the gate pattern is obtained by subjecting a gate film to exposure and to dry etching and the gate film is formed by physical vapor deposition, wherein the substrate, the black matrix pattern, and the gate pattern are provided thereon with a gate insulator film, wherein the gate pattern covered by the gate insulator film is provided thereon with a source and a drain, wherein an IGZO film is provided on a part of the gate insulator film which covers the gate pattern covered and is between the source and the drain, wherein a passivation film is provided on the source and the drain, the IGZO film, and the gate insulator film, wherein the passivation film has a contact hole at a position corresponding to the source and the drain, and the passivation film, except the contact hole, is coated with R/G/B color resist, and the contact hole and the opening area are covered with an ITO pattern.

9. The BOA liquid crystal panel based on an IGZO-TFT according to claim 8, characterized in that the black matrix pattern is formed of copper oxide.

* * * * *